(12) United States Patent
Sun

(10) Patent No.: US 7,012,319 B2
(45) Date of Patent: Mar. 14, 2006

(54) SYSTEM FOR INTEGRATING A CIRCUIT ON AN ISOLATION LAYER AND METHOD THEREOF

(75) Inventor: Wein-Town Sun, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/750,752

(22) Filed: Jan. 2, 2004

(65) Prior Publication Data

US 2005/0082623 A1  Apr. 21, 2005

(30) Foreign Application Priority Data

Oct. 17, 2003  (TW) .............................. 92128816 A

(51) Int. Cl.
| | |
|---|---|
| H01L 21/44 | (2006.01) |
| H01L 21/48 | (2006.01) |
| H01L 21/50 | (2006.01) |
| H01L 21/331 | (2006.01) |
| H01L 21/46 | (2006.01) |

(52) U.S. Cl. ...................... 257/618; 257/619; 257/620; 438/113; 438/155; 438/294; 438/352; 438/353; 438/455; 438/458

(58) Field of Classification Search ................ 438/110, 438/113, 155, 294, 352, 353, 455, 458, 149, 438/464, 460–462
See application file for complete search history.

(56) References Cited

U.S. PATENT DOCUMENTS

| | | | | |
|---|---|---|---|---|
| 5,832,585 A | * | 11/1998 | Takiar et al. ................. | 29/424 |
| 5,963,785 A | * | 10/1999 | Katoh et al. .................. | 438/33 |
| 6,403,448 B1 | * | 6/2002 | Reddy ......................... | 438/460 |
| 6,414,396 B1 | * | 7/2002 | Shim et al. .................. | 257/778 |
| 6,689,636 B1 | * | 2/2004 | Liao et al. ................... | 438/107 |
| 6,773,976 B1 | * | 8/2004 | Kim ............................ | 438/224 |
| 6,791,127 B1 | * | 9/2004 | Nunokawa .................. | 257/203 |
| 2001/0031514 A1 | * | 10/2001 | Smith .......................... | 438/107 |
| 2002/0126108 A1 | | 9/2002 | Koyama et al. ............ | 345/204 |
| 2002/0168800 A1 | * | 11/2002 | Smith et al. ................ | 438/128 |
| 2002/0173080 A1 | * | 11/2002 | Saia et al. ................... | 438/118 |
| 2002/0192867 A1 | * | 12/2002 | Nishiyama .................. | 438/110 |
| 2004/0023469 A1 | * | 2/2004 | Suda ........................... | 438/458 |

* cited by examiner

*Primary Examiner*—Tom Thomas
*Assistant Examiner*—Jesse A. Fenty
(74) *Attorney, Agent, or Firm*—Thomas, Kayden, Horstemeyer & Risley

(57) ABSTRACT

A method for integrating a system on an isolation layer. A first isolation substrate including a first circuit deposition region and a first substrate-combining region, and a second isolation substrate including a second circuit deposition region and a second substrate-combining region are provided. Next, a first circuit and a second circuit are respectively formed on the first circuit deposition region and the second circuit deposition region. Next, substrate-connecting elements are formed to connect the first substrate-combining region to the second substrate-combining region. Finally, electrical connecting elements are formed to electrically connect the first circuit and the second circuit.

20 Claims, 5 Drawing Sheets

SYSTEM FOR INTEGRATING A CIRCUIT ON AN ISOLATION LAYER AND METHOD THEREOF

BACKGROUND OF THE INVENTION

The present invention relates in general to a system for integrating a circuit on an isolation layer and method thereof. In particular, the present invention relates to a method for integrating circuits on different isolation layers and combining the circuits and the isolation layers.

DESCRIPTION OF THE RELATED ART

System on glass (SOG) is a low-temperature poly-silicon (LTPS) technology of interest. SOG technology is related to form peripheral circuits on a glass substrate to reduce cost and product size. In general, the cost of a drive IC is 6% of that of a 12-inch SVGA liquid crystal display (LCD). Thus, the low cost of a drive IC manufactured by LTPS technology is a vantage on marketing.

SONY corporation recently disclosed a video system on glass at Europe Display conference (EDC) in 2002. The video system forms the driving circuit of the LCD panel on glass by LTPS technology. FIG. 1 is a circuit diagram showing the driving circuit of a LCD panel, comprising gate driver 10, interface circuit 12, timing generator 14, reference driver 16, DC-to-DC converter 18 and source driver 19. Power consumption of the driving circuit is reduced because additional ICs are omitted. Additionally, Sharp and Philips have disclosed similar panel technology. Moreover, Sharp has disclosed the ability to form a CPU on glass. Fujitsu and Seiko corporations have also recently disclosed similar technologies respectively at Society for Information Display (SID) and International Display Works (IDW) conference in 2002. Thus, the combination of CPU and memory on glass by LTPS technology is anticipated.

However, reliability is a serious concern when mass producing SOG products. Since circuits with different process parameters are combined and manufactured together in a single system, problems occurring in any individual circuit affect the entire system. Thus, the reliability of the products manufactured by SOG technology is seriously diminished.

U.S. application 20020126108A1 provides a method for forming the CPU, the memory, the control circuit and the display device on at least two substrates, and mounting the substrates on one of the substrate. Thus, the product reliability is increased, but the size, especially the thickness, of the product is also increased.

SUMMARY OF THE INVENTION

The object of the present invention is thus to provide a method for integrating a system on an isolation layer by individually forming different kinds of circuits, including display circuits, control circuits, CPUs and memory circuits, on different isolation layers, after cutting the isolation layers and leaving an individual circuit on the cut isolation layer, the cut isolation layer and the individual circuit are combined with others isolation layers and circuits thereon. In addition, the manufacturing processes, design rules, package methods and radiator methods of the circuits are selected according to their characteristics.

To achieve the above-mentioned object, the present invention provides a method for integrating a system on an isolation layer. A first isolation substrate including a first circuit deposition region and a first substrate-combining region, and a second isolation substrate including a second circuit deposition region and a second substrate-combining region are provided. Next, a first circuit and a second circuit are respectively formed on the first circuit deposition region and the second circuit deposition region. Next, substrate-connecting elements are formed to connect the first substrate-combining region to the second substrate-combining region. Finally, electrical connecting elements are formed to electrically connect the first circuit and the second circuit.

In addition, the present invention provides a system for integrating circuitry on an isolation layer. A plurality of isolation substrates, including a circuit deposition region and a substrate-combining region are provided. A plurality of circuits is formed on the circuit deposition regions. A plurality of substrate-connecting elements is formed to connect the substrate-combining regions. A plurality of electrical connecting elements is formed to electrically connect the circuits formed on the different circuit deposition regions.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
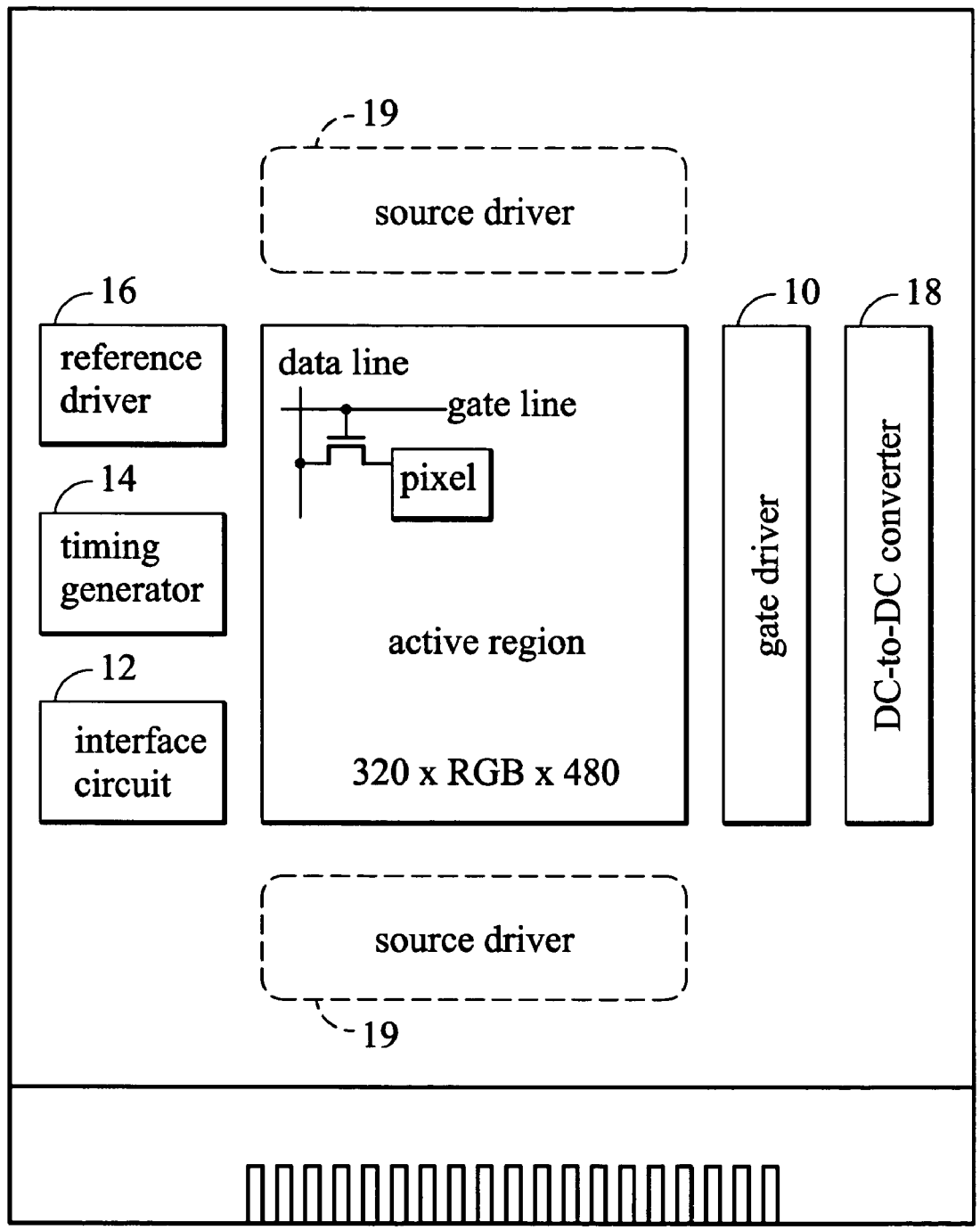
FIG. 1 is a circuit diagram showing the driving circuit of a LCD panel.
Figure 2:
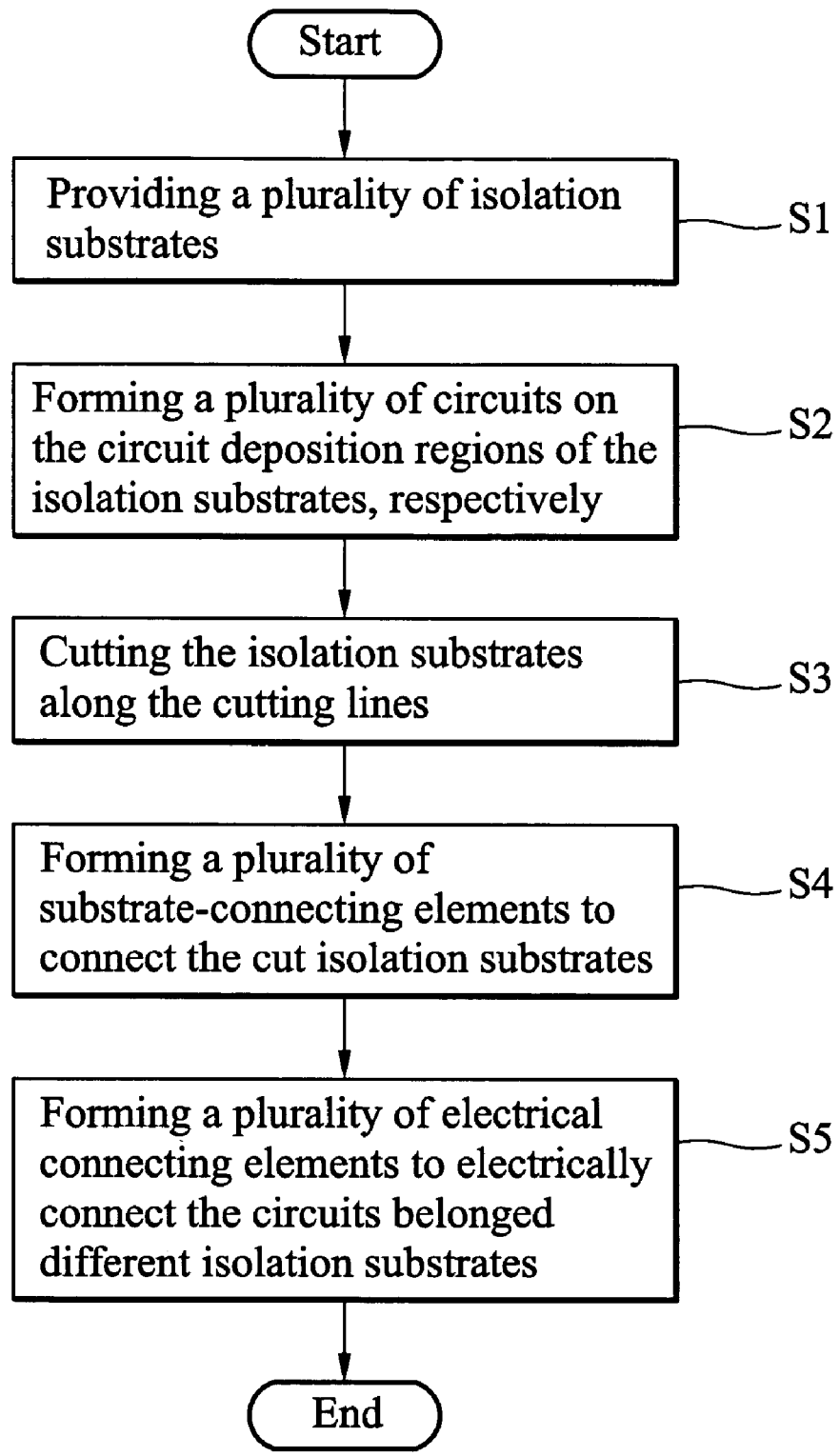
FIG. 2 is a flowchart illustrative of integrating a system on an isolation layer according to the embodiment of the present invention.
Figure 3:
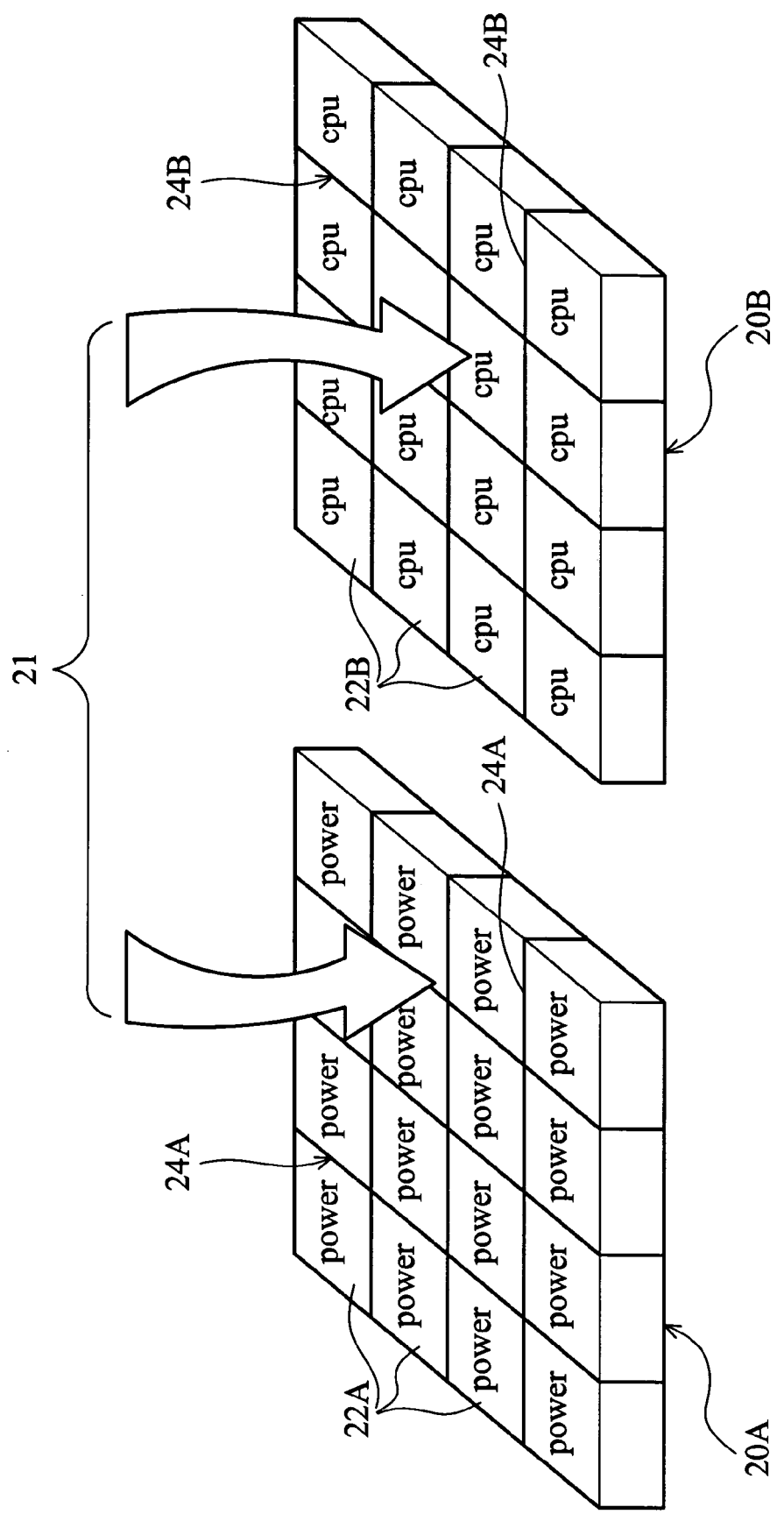
FIG. 3 shows the outer views of the isolation substrates 20A and 20B.
Figure 4:
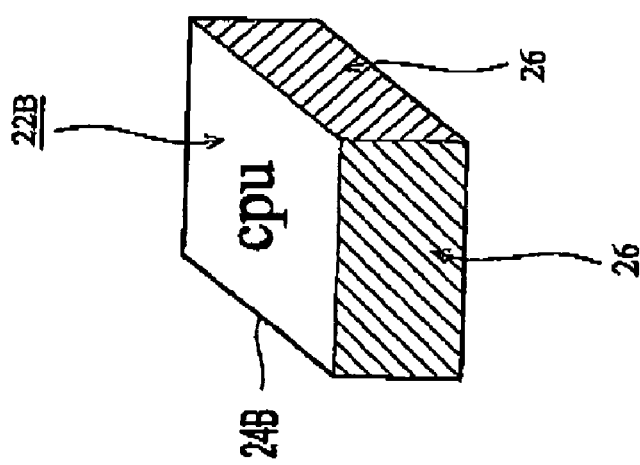
FIG. 4 shows the outer views of the cut isolation substrate and the circuit block thereof.
Figure 5A:
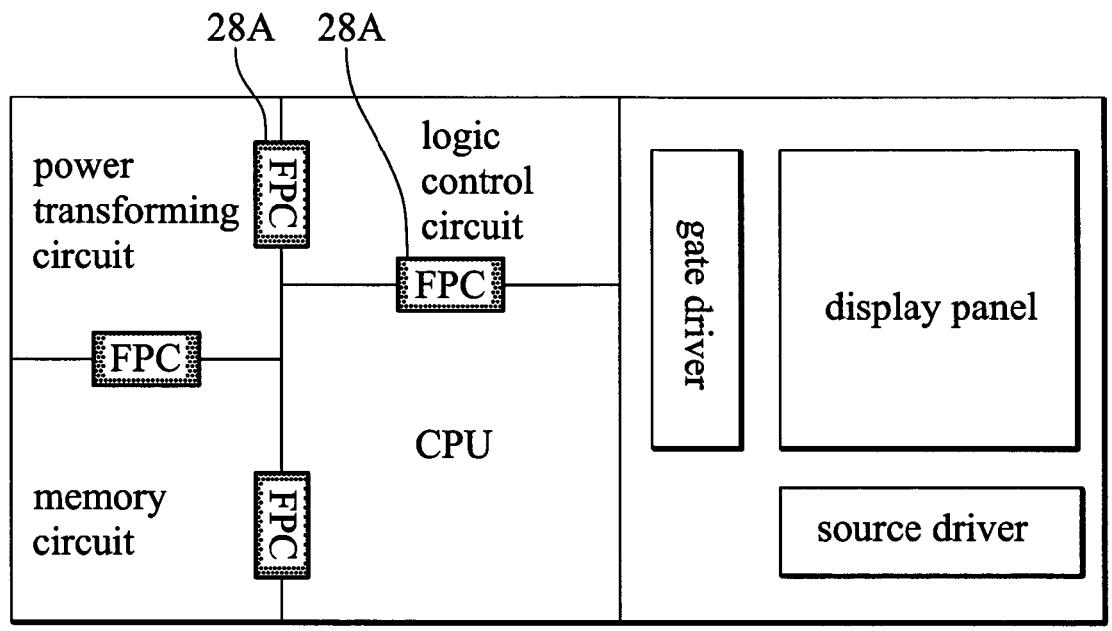
FIGS. 5A and 5B show the circuit blocks are connected by the electrical connecting elements.
Figure 5B:
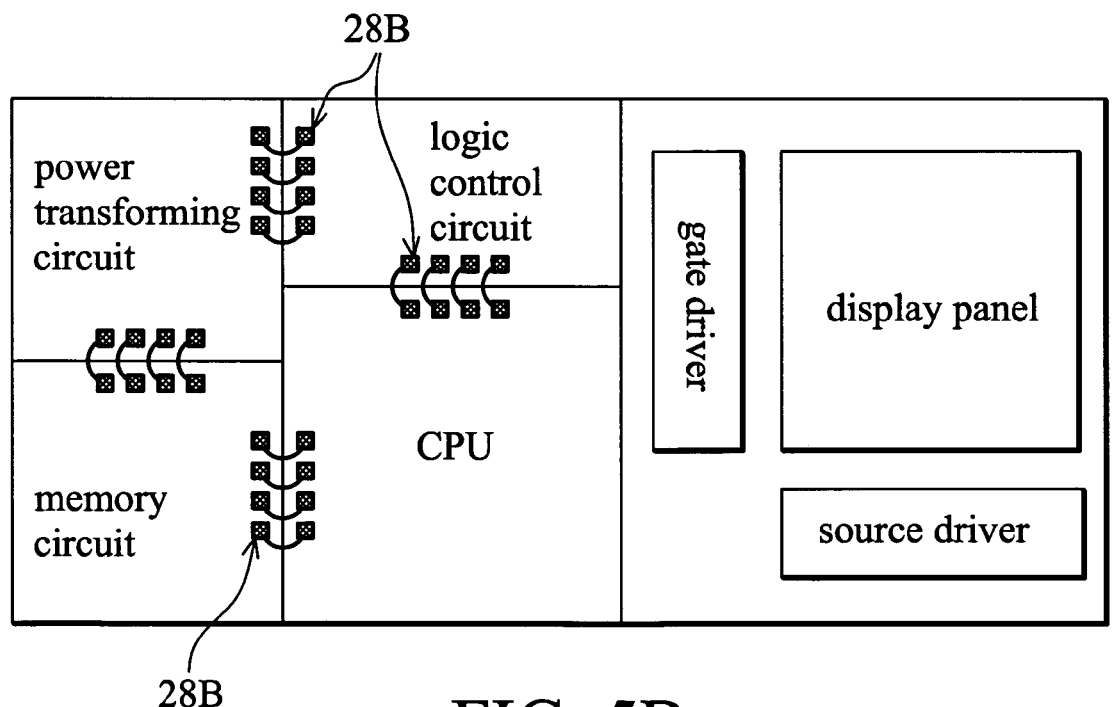

FIG. 2 is a flowchart illustrative of integrating a system on an isolation layer according to the embodiment of the present invention. First, a plurality of isolation substrates is provided (S1). The material of the isolation substrates can be plastic or glass. Here, the material of the isolation substrate is determined according to the following manufacturing process. FIG. 3 shows the outer views of the isolation substrates 20A and 20B. As shown in FIG. 3, the arrow indicates the circuit deposition region. Next, a plurality of circuits is formed on the circuit deposition regions 21 of the isolation substrates 20A and 20B, respectively (S2). The circuits can be power converting circuits, memory circuits, logic control circuits, CPUs, display panels, and driving circuits for driving the panel. For example, the power converting circuit POWER is formed on the isolation substrate 20A and the CPU is formed on the isolation substrate 20B. In the present invention, the circuits on the single isolation substrate can be formed by the same manufacturing process. For example, if the circuits are all formed by a CMOS process, the circuits can be formed together on a single isolation substrate. In addition, the electrical elements having different process parameters are formed on different isolation substrates, for example, the thickness of gate oxide layers of memory devices and periphery circuits are different. In addition, circuits formed by the processes requiring different numbers of masks, circuits with different design rules, package methods and radiator methods are formed on different isolation substrates to simplify the manufacturing process. In the present invention, a plurality of circuits is formed on a single isolation substrate. As shown in FIG. 3, there are a plurality of power converting circuits POWER formed on isolation substrate 22A and the CPU blocks formed on isolation substrate 22B. Next, the isolation substrates 20A and 20B are cut along cutting lines 24A and 24B (S3). As shown in FIG. 4, only the single CPU block is left on the cut isolation substrate 20B. The top surface of the cut isolation substrate 20B is a circuit deposition region 21, which is deposited on the CPU block, and the side surfaces 26 of the cut isolation substrate 20B contiguous to the circuit deposition region 21 are substrate-combining regions. Next, a plurality of substrate-connecting elements is formed to connect the cut isolation substrates (S4), wherein the substrate-combining regions contact of the cut isolation substrates. Here, the substrate-connecting elements can be viscose, or formed by laser or heat fusion. Finally, a plurality of electrical connecting elements is formed to electrically connect the circuits on different isolation substrates (S5). FIGS. 5A and 5B show the circuit blocks connected by the electrical connecting elements, wherein the isolation substrates are in contact. In the embodiment of the present invention, the electrical connecting elements are flex print cables (shown in FIG. 5A), gold lines (shown in FIG. 5B), or formed by laser fusion.

According to the system for integrating a circuit on an isolation layer and the method thereof disclosed by the embodiment of the present invention, the thickness of the system is reduced because the isolation substrates are joined by the side surfaces thereof. Thus, the disadvantage of the method disclosed by U.S. application 20020126108A1 is avoided. In addition, the method disclosed by the present invention forms the electrical elements with different process parameters on the different isolation layers. The isolation layer and the electrical elements are then respectively combined with other isolation layers and the electrical elements thereon. Thus, the reliability of the products and the design elasticity of the SOG technology are improved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A system for integrating circuitry on an isolation layer, comprising:
    a plurality of isolation substrates, each isolation substrate having a circuit deposition region and a substrate-combining region;
    a plurality of circuits formed on the circuit deposition regions;
    a plurality of substrate-connecting elements formed to connect the substrate-combining regions; and
    a plurality of electrical connecting elements formed to electrically connect the circuits formed on the different circuit deposition regions, wherein the circuit deposition region contacts the substrate-combining region on more than one face thereof, and wherein at least two isolation substrates contact at respective substrate-combining regions.

2. The system as claimed in claim 1, wherein the substrate-connecting elements are formed by heat fusing or laser.

3. The system as claimed in claim 1, wherein the electrical connecting elements are flex print cables or gold lines.

4. The system as claimed in claim 1, wherein the electrical connecting elements are formed by laser fusing.

5. The system as claimed in claim 1, wherein the materials of the isolation substrates are different.

6. The system as claimed in claim 1, wherein the materials of the isolation substrates are plastic or glass.

7. A method for integrating a system on an isolation layer, comprising the following steps:
    providing a first isolation substrate including a first circuit deposition region and a first substrate-combining region, and a second isolation substrate including a second circuit deposition region and a second substrate-combining region;
    forming a first circuit and a second circuit respectively on the first circuit deposition region and the second circuit deposition region;
    contacting the first substrate-combining region and the second substrate-combining region;
    forming a plurality of substrate-connecting elements for connecting the first substrate-combining region to the second substrate-combining region; and
    forming a plurality of electrical connecting elements to electrically connect the first circuit and the second circuit.

8. The method for integrating a system on an isolation layer as claimed in claim 7, wherein the substrate-connecting elements are formed by heat fusing or laser.

9. The method for integrating a system on an isolation layer as claimed in claim 7, wherein the electrical connecting elements are flex print cables or gold lines.

10. The method for integrating a system on an isolation layer as claimed in claim 7, wherein the electrical connecting elements are formed by laser fusing.

11. The method for integrating a system on an isolation layer as claimed in claim 7, wherein the first circuit and the second circuit are packed by different packaging methods.

12. The method for integrating a system on an isolation layer as claimed in claim 7, wherein the material of the first isolation substrate and the second isolation substrate is plastic.

13. The method for integrating a system on an isolation layer as claimed in claim 7, wherein the material of the first isolation substrate and the second isolation substrate are glass.

14. A method for integrating a system on an isolation layer, comprising the following steps:
    providing a first isolation substrate and a second isolation substrate respectively including a first circuit deposition region and a second circuit deposition region;
    forming a plurality of first circuits and a plurality of second circuits respectively on the first circuit deposition region and the second circuit deposition region;
    cutting the first isolation substrate and the second isolation substrate, wherein the cut first isolation substrate comprises single first circuit and a first substrate-combining region, and the cut second isolation substrate comprises a single second circuit and a second substrate-combining region;

forming a plurality of substrate-connecting elements for connecting the cut first isolation substrate to the cut second isolation substrate, wherein the first substrate-combining region contacts the second substrate-combining region; and forming a plurality of electrical connecting elements to electrically connect the single first circuit and the single second circuit.

15. The method for integrating a system on an isolation layer as claimed in claim 14, wherein the substrate-connecting elements are formed by heat fusing or laser.

16. The method for integrating a system on an isolation layer as claimed in claim 14, wherein the electrical connecting elements are flex print cables or gold lines.

17. The method for integrating a system on an isolation layer as claimed in claim 14, wherein the electrical connecting elements are formed by laser fusing.

18. The method for integrating a system on an isolation layer as claimed in claim 14, wherein the material of the first isolation substrate is plastic.

19. The method for integrating a system on an isolation layer as claimed in claim 14, wherein the material of the second isolation substrate is glass.

20. A method for integrating a system on an isolation layer, comprising the following steps:

providing a first isolation substrate including a first circuit deposition region and a first substrate-combining region, and a second isolation substrate including a second circuit deposition region and a second substrate-combining region, wherein the materials of the first and second isolation substrates are different;

forming a first circuit and a second circuit respectively on the first circuit deposition region and the second circuit deposition region;

forming a plurality of substrate-connecting elements for connecting the first substrate-combining region to the second substrate-combining region; and forming a plurality of electrical connecting elements to electrically connect the first circuit and the second circuit.

* * * * *